United States Patent
Nakano et al.

(10) Patent No.: US 9,673,092 B2
(45) Date of Patent: Jun. 6, 2017

(54) FILM FORMING APPARATUS, AND METHOD OF MANUFACTURING SEMICONDUCTOR DEVICE

(71) Applicant: ASM IP HOLDING B.V., Almere (NL)

(72) Inventors: Ryu Nakano, Sagamihara (JP); Noboru Takamure, Kawasaki (JP); Hiroki Arai, Fuchu (JP)

(73) Assignee: ASM IP Holding B.V., Almere (NL)

(*) Notice: Subject to any disclaimer, the term of this patent is extended or adjusted under 35 U.S.C. 154(b) by 39 days.

(21) Appl. No.: 14/199,946

(22) Filed: Mar. 6, 2014

(65) Prior Publication Data
US 2015/0252479 A1 Sep. 10, 2015

(51) Int. Cl.
| | |
|---|---|
| C23C 16/00 | (2006.01) |
| H01L 21/00 | (2006.01) |
| H01L 21/768 | (2006.01) |
| C23C 16/455 | (2006.01) |
| C23C 16/44 | (2006.01) |
| C23C 16/509 | (2006.01) |
| H01J 37/32 | (2006.01) |

(52) U.S. Cl.
CPC .... *H01L 21/76879* (2013.01); *C23C 16/4404* (2013.01); *C23C 16/4405* (2013.01); *C23C 16/4412* (2013.01); *C23C 16/45544* (2013.01); *C23C 16/5096* (2013.01); *H01J 37/32091* (2013.01); *H01J 37/32449* (2013.01); *H01J 37/32834* (2013.01)

(58) Field of Classification Search
USPC ...................................... 156/916; 118/723 R
See application file for complete search history.

(56) References Cited

U.S. PATENT DOCUMENTS

| | | | |
|---|---|---|---|
| 4,512,283 A * | 4/1985 | Bonifield et al. | 118/723 E |
| 5,366,585 A | 11/1994 | Robertson et al. | |
| 5,593,541 A * | 1/1997 | Wong et al. | 438/654 |
| 5,728,278 A * | 3/1998 | Okamura et al. | 204/298.11 |
| 6,056,823 A * | 5/2000 | Sajoto et al. | 118/715 |
| 6,277,237 B1 * | 8/2001 | Schoepp et al. | 156/345.1 |
| 6,899,507 B2 | 5/2005 | Yamagishi et al. | |
| 7,011,039 B1 * | 3/2006 | Mohn et al. | 118/723 R |
| 7,021,881 B2 | 4/2006 | Yamagishi et al. | |
| 8,343,307 B2 * | 1/2013 | Huston | H01J 37/32082 118/715 |
| 8,404,048 B2 * | 3/2013 | Ewert et al. | 118/725 |
| 2007/0071992 A1 * | 3/2007 | Okoroafor | 428/632 |
| 2009/0031953 A1 * | 2/2009 | Ingle et al. | 118/723 R |
| 2011/0162803 A1 * | 7/2011 | Palagashvili et al. | 156/345.54 |
| 2012/0132532 A1 * | 5/2012 | Kenworthy et al. | 205/158 |

FOREIGN PATENT DOCUMENTS

WO    WO 9853486 A2 * 11/1998

* cited by examiner

*Primary Examiner* — Sylvia R MacArthur
*Assistant Examiner* — Anna Crowell
(74) *Attorney, Agent, or Firm* — Studebaker & Brackett PC

(57) ABSTRACT

A film forming apparatus includes a reactor chamber, a first electrode provided in the reactor chamber and receiving electrical power, a second electrode provided in the reactor chamber and facing the first electrode, a gas supply inlet for supplying material gas to a space between the first and second electrodes, and a gas exhaust outlet for discharging the material gas. Insulating material is not exposed to a flow path for the material gas in the reactor chamber.

6 Claims, 6 Drawing Sheets

| Ex. | Temp[°C] | Precursor | RF power[W] (13.65MHz) | N2/H2/O2 flow [sccm] | Reactant gas |
|---|---|---|---|---|---|
| 1 | 200 | TDMAT | 400 | 200/100/0 | N2/H2 |
| 2 | 200 | TDMAT | 400 | 200/600/0 | N2/H2 |
| 3 | 200 | TDMAT | 600 | 200/600/0 | N2/H2 |
| 4 | 200 | TDMAT | 400 | 0/600/0 | N2 |

TDMAT(tetrakis dimethylamino titanium)

FILM FORMING APPARATUS, AND METHOD OF MANUFACTURING SEMICONDUCTOR DEVICE

BACKGROUND OF THE INVENTION

Field of the Invention

The present invention relates to a film forming apparatus for forming a film on a substrate by generating a plasma, and also relates to a method of manufacturing a semiconductor device.

Background Art

Both plasma enhanced atomic layer deposition (PEALD) and plasma chemical vapor deposition (plasma CVD) are film forming methods for forming a film by generating a plasma in a material gas. U.S. Pat. No. 5,366,585 discloses a film forming apparatus having a plasma reactor chamber.

Film forming apparatuses using a plasma include an insulator disposed so that the electrode for receiving power for generating a plasma is insulated from the surrounding components. In some film forming apparatuses, this insulator is exposed to the material gas flow path in the chamber. In such film forming apparatuses, formation of a metal film on a substrate, etc. in the chamber is accompanied by formation of a metal film on the insulator, during which the impedance of the plasma varies, resulting in unstable film forming operation. Further, when an insulating film is formed in the film forming apparatuses, a potential difference in the insulator causes generation of a plasma in the material gas flow path, also resulting in unstable film forming operation.

SUMMARY OF THE INVENTION

The present invention has been made to solve the above problems. It is, therefore, an object of the present invention to provide a film forming apparatus and a method of manufacturing a semiconductor device which ensure stable film forming operation.

The features and advantages of the present invention may be summarized as follows.

According to one aspect of the present invention, a film forming apparatus includes a reactor chamber, a first electrode provided in the reactor chamber and receiving electrical power, a second electrode provided in the reactor chamber and facing the first electrode, a gas supply inlet for supplying material gas to a space between the first and second electrodes, and a gas exhaust outlet for discharging the material gas. Insulating material is not exposed to a flow path for the material gas in the reactor chamber.

According to another aspect of the present invention, a method of manufacturing a semiconductor device using a plasma film forming apparatus, the plasma film forming apparatus having a reactor chamber and an insulator exposed to a material gas flow path in the reactor chamber, the method includes when the reactor chamber contains no substrate to be processed, forming a metal film on the insulator using a plasma so that the insulator is no longer exposed to the material gas flow path, and after the forming of the metal film on the insulator, introducing a substrate to be processed into the plasma film forming apparatus and forming a film on the substrate to be processed using a plasma.

According to another aspect of the present invention, a method of manufacturing a semiconductor device using a film forming apparatus, the film forming apparatus having a reactor chamber, a gas exhaust outlet, and an exhaust side insulating part for guiding a material gas from within the reactor chamber to the gas exhaust outlet, the exhaust side insulating part being covered with an exhaust side metal film so that the exhaust side insulating part is not directly exposed to a flow path for the material gas in the reactor chamber, the method includes forming a film on a substrate in the film forming apparatus using a plasma, and after the forming of the film on the substrate, cleaning an inside of the reactor chamber using a cleaning gas to remove a film which has been deposited from the material gas, while leaving the exhaust side metal film intact.

According to another aspect of the present invention, a film forming apparatus includes a reactor chamber, a first electrode provided in the reactor chamber and receiving electrical power, a second electrode provided in the reactor chamber and facing the first electrode, a gas supply inlet for supplying material gas to a space between the first and second electrodes, a gas exhaust outlet for discharging the material gas, and a separation ring having a insulating portion and a metal portion, the separation ring is provided between the first electrode and the reactor chamber so that the first electrode is insulated from the reactor chamber.

Other and further objects, features and advantages of the invention will appear more fully from the following description.

DETAILED DESCRIPTION OF THE PREFERRED EMBODIMENTS

Figure 1:
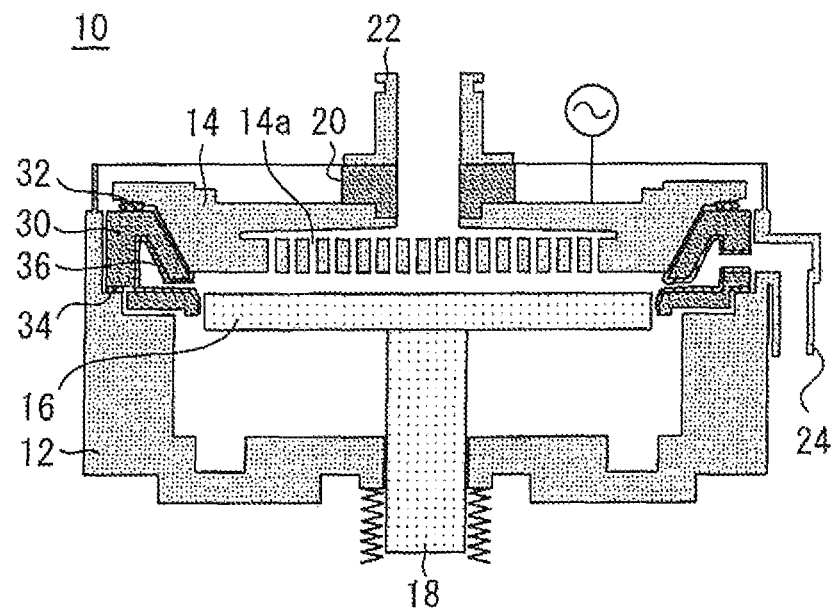
FIG. 1 is a cross-sectional view of a film forming apparatus in accordance with a first embodiment.

Film forming apparatuses and methods of manufacturing a semiconductor device in accordance with embodiments of the present invention will be described with reference to the accompanying drawings. Throughout the specification the same or corresponding components are designated by the same reference numerals and may be described only once.

First Embodiment

FIG. 1 is a cross-sectional view of a film forming apparatus 10 in accordance with a first embodiment of the present invention. The film forming apparatus 10 includes a reactor chamber 12 formed of a metal. A first electrode 14 is provided in the reactor chamber 12. The first electrode 14 receives electrical power such as RF power. The first electrode 14 has holes 14a formed therein.

A second electrode 16 is also provided in the reactor chamber 12 and faces the first electrode 14. The second electrode 16 is a susceptor supported by a sliding shaft 18. The second electrode 16 is grounded. Thus, the first electrode 14 and the second electrode 16 form a parallel plate structure.

A gas supply inlet 22 is connected to the first electrode 14 through an insulating part 20. The gas supply inlet 22 is used to supply material gas to the space between the first electrode 14 and the second electrode 16. The insulating part 20 is formed of an insulating material and serves to electrically isolate the first electrode 14 from the gas supply inlet 22.

The reactor chamber 12 has a gas exhaust outlet 24 on a side thereof. The gas exhaust outlet 24 is used to discharge the material gas remaining in the reactor chamber 12 after the film forming process. For that purpose a vacuum pump is connected to the gas exhaust outlet 24.

An exhaust side insulating part 30 is provided between the first electrode 14 and the reactor chamber 12. The exhaust side insulating part 30 is formed of, e.g., ceramic. An O-ring 32 is interposed and suitably compressed between the exhaust side insulating part 30 and the first electrode 14. An O-ring 34 is interposed and suitably compressed between the exhaust side insulating part 30 and the reactor chamber 12.

The exhaust side insulating part 30 serves two functions. A first function is to electrically isolate the first electrode 14, to which power is applied, from the reactor chamber 12, which is at GND potential. Therefore, the exhaust side insulating part 30 is formed of an insulating material. The second function is to guide the material gas from between the first electrode 14 and the second electrode 16 to the gas exhaust outlet 24. The exhaust side insulating part 30 has an annular shape so as to laterally surround the second electrode 16 and guide the material gas to the gas exhaust outlet 24.

Figure 2:
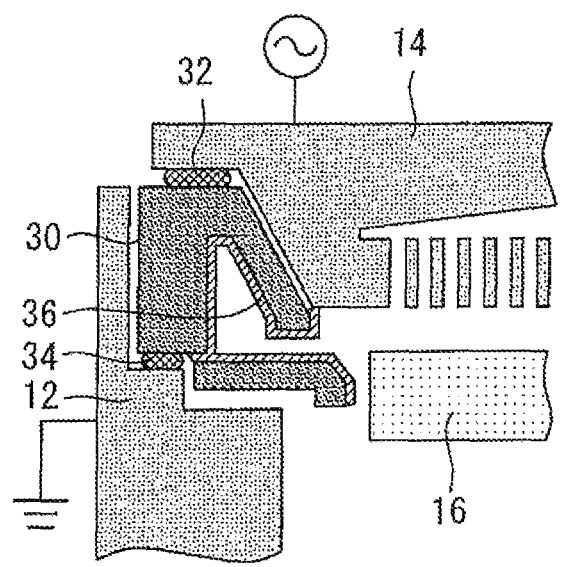
FIG. 2 is an enlarged view of the exhaust side insulating part.

FIG. 2 is an enlarged view of the exhaust side insulating part 30 and the surrounding components shown in FIG. 1. As shown in FIG. 2, an exhaust side metal film 36 is formed on the inner surface of the exhaust side insulating part 30. Specifically, the exhaust side metal film 36 covers the inner surface of the exhaust side insulating part 30 in a manner without electrically connecting the first electrode 14 to the reactor chamber 12. The exhaust side metal film 36 is formed of, e.g., Al. As a result of the formation of the exhaust side metal film 36, the exhaust side insulating part 30 is not exposed to the material gas flow path in the reactor chamber 12. In other words, the material gas flow path in the reactor chamber 12 is surrounded by only metal walls and hence no insulating material is exposed to the material gas flow path.

Figures 3, 4:
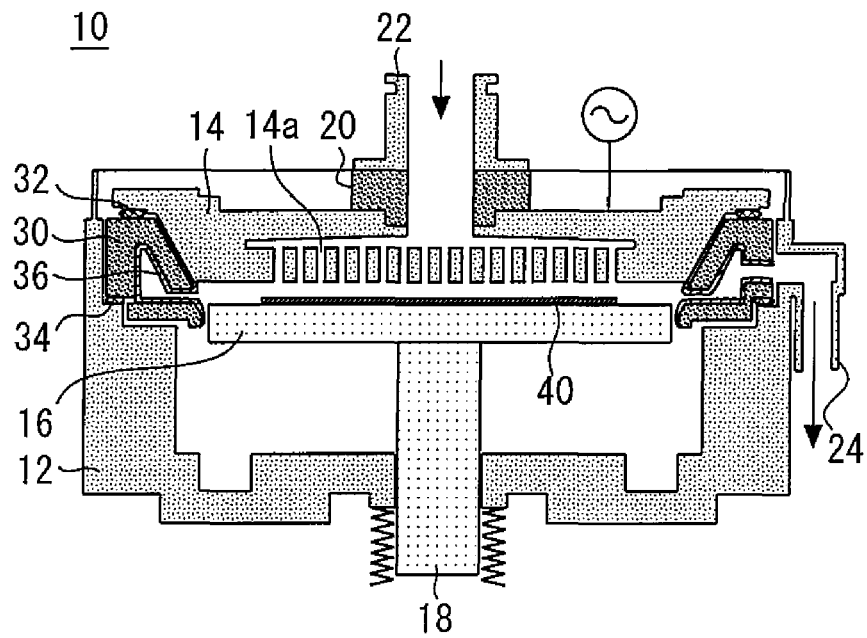
FIG. 3 shows a method of manufacturing a semiconductor device.
FIG. 4 shows Examples of conditions for forming the TiN film.

A method of manufacturing a semiconductor device using the film forming apparatus 10 will be described with reference to FIG. 3. First, a substrate 40 is mounted on the second electrode 16 of the film forming apparatus 10. The substrate 40 may be a wafer having a circular shape, as viewed in plan, or a flat panel display substrate having a rectangular shape, as viewed in plan.

The method then proceeds to a film forming step. In this step, a film of titanium nitride (TiN) is formed by PEALD. Specifically, first, a material gas for depositing titanium nitride is supplied to the inside of the film forming apparatus 10 through the gas supply inlet 22 located directly above the central portion of the substrate 40, as indicated by an arrow in FIG. 3. Examples of conditions for forming the TiN film are shown in FIG. 4. The material gas then flows through the holes 14a to the space between the first electrode 14 and the second electrode 16. There is an electric field between the first electrode 14 and the second electrode 16, since electric power is applied between these electrodes. This electric field produces a plasma in the material gas, resulting in the formation of a titanium nitride film on the substrate 40. The material gas remaining in the film forming apparatus 10 is then evacuated from the space between the first electrode 14 and the second electrode 16 into the gas exhaust outlet 24 through the exhaust side insulating part 30 and discharged from the film forming apparatus 10.

That is, in this film forming step, a material gas is supplied to the space between the first electrode 14 and the second electrode 16 and then caused to flow to the gas exhaust outlet 24 through the exhaust side insulating part 30, which is covered with the exhaust side metal film 36. It should be noted that the exhaust side insulating part 30 is not directly exposed to this material gas flow path even at the beginning of the film forming step, since the exhaust side insulating part 30 is covered with the exhaust side metal film 36.

After a film has been formed on a predetermined number of substrates in this film forming step, the method proceeds to a cleaning step to remove deposited material from within the film forming apparatus 10. Specifically in this cleaning step, the inside of the reactor chamber 12 is cleaned using a cleaning gas to remove films which have been deposited from the material gas, while leaving the exhaust side metal film 36 intact. The cleaning gas is, e.g., a fluorine-based gas, since such a gas can be used to remove films of titanium nitride from within the film forming apparatus 10 (which films have been deposited from the material gas) while leaving intact the exhaust side metal film 36 of Al. After this cleaning step, the next film forming step (for other substrates) may be initiated, since deposited material has been removed from within the film forming apparatus 10 without removing the exhaust side material film 36, which covers the exhaust side insulating part 30 and will prevent the exhaust side insulating part 30 from being exposed to the material gas flow path in the reactor chamber 12 at the beginning of the next film forming step, as in the previous film forming step.

Figure 5:
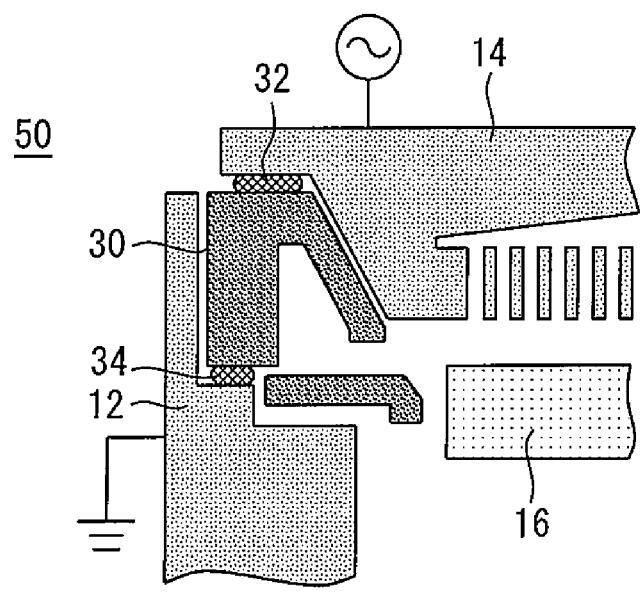
FIG. 5 is a cross-sectional view of the exhaust side insulating part in accordance with a first comparative example.

To facilitate the understanding of the advantages of the film forming apparatus and the method of manufacturing a semiconductor device in accordance with the first embodiment, the following description will be directed to a first comparative example and a second comparative example. In the first comparative example, a metal film is formed using a film forming apparatus 50. FIG. 5 is a cross-sectional view of the exhaust side insulating part and the surrounding components of the film forming apparatus 50. The film forming apparatus 50 differs from the film forming apparatus 10 of the first embodiment in that the exhaust side metal film 36 is omitted and, as a result, the exhaust side insulating part 30 is exposed. That is, in the film forming apparatus 50, the exhaust side insulating part 30 is exposed to the material gas flow path in the reactor chamber 12.

Figure 6:
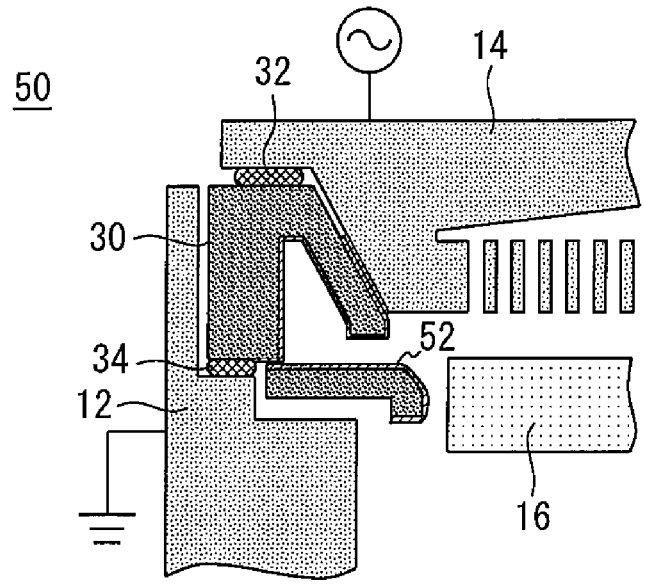
FIG. 6 is a cross-sectional view of the exhaust side insulating part in accordance with a first comparative example.

When a titanium nitride film is formed in the film forming apparatus 50 by PEALD, titanium nitride is inevitably deposited on the exhaust side insulating part 30. FIG. 6 is a cross-sectional view of the exhaust side insulating part 30 with titanium nitride 52 deposited thereon. Titanium nitride 52 is deposited both on the exhaust side insulating part 30 and the first electrode 14. It should be noted that the impedance of the plasma varies during the course of the deposition of titanium nitride on the exhaust side insulating part 30, meaning that the effective power applied to the plasma varies with time. This prevents the film forming apparatus 50 from reliably forming a metal film in the first comparative example.

Figure 7:
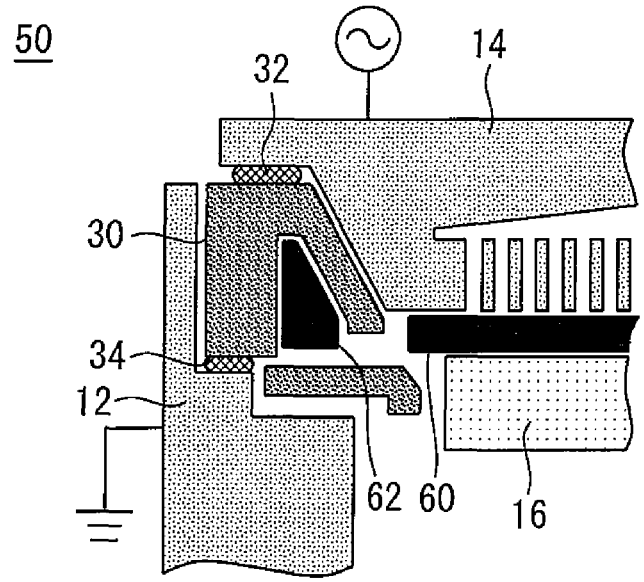
FIG. 7 is a cross-sectional view of the exhaust side insulating part in accordance with a second comparative example.

In the second comparative example, the film forming apparatus 50 described above in connection with the first comparative example is used to form an insulating film. FIG. 7 is a cross-sectional view of the exhaust side insulating part 30 and the surrounding components of the film forming apparatus 50 when an insulating film is formed in the film forming apparatus 50. As shown in FIG. 7, a plasma 62 is generated in the space surrounded by the exhaust side insulating part 30 while a plasma 60 is generated in the space between the first electrode 14 and the second electrode 16. The generation of the plasma 62 is caused by a potential difference in the exhaust side insulating part 30 and prevents the film forming apparatus 50 from reliably forming a film.

An important feature of the film forming apparatus 10 of the present invention is that the exhaust side insulating part 30, which defines a portion of the material gas flow path in the reactor chamber 12, is covered by the exhaust side metal film 36 so that the exhaust side insulating part 30 is not directly exposed to the material gas flow path even at the beginning of the film forming process. It should be noted that during the film forming process in the reactor chamber 12, a metal film (of titanium nitride) is formed on the exhaust side metal film 36 of the exhaust side insulating part 30 as well as on the substrate on the second electrode 16. However, the impedance of the plasma in the space between the first electrode 14 and the second electrode 16 is substantially equal when the exhaust side metal film 36 is exposed to the material gas flow path (i.e., immediately after the initiation of the film forming process in the reactor chamber 12) and when the metal film which has been deposited on the exhaust side metal film 36 is exposed to the material gas flow path (i.e., during the film forming process). Thus the impedance of the plasma remains substantially constant from the beginning to the end of the film forming process, ensuring stable film forming operation.

Further, when an insulating film is formed in the film forming apparatus 10, the exhaust side metal film 36 serves to prevent a potential difference from being generated in the exhaust side insulating part 30. This prevents generation of a plasma in the space surrounded by the exhaust side insulating part 30, resulting in stable film forming operation.

Figure 8:
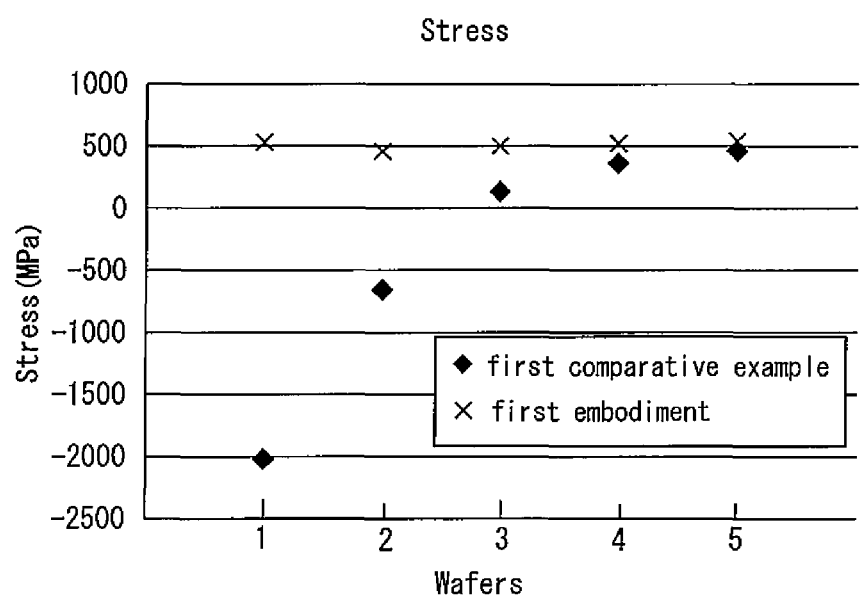
FIG. 8 is a diagram showing measured values of the stress in metal films.
Figure 9:
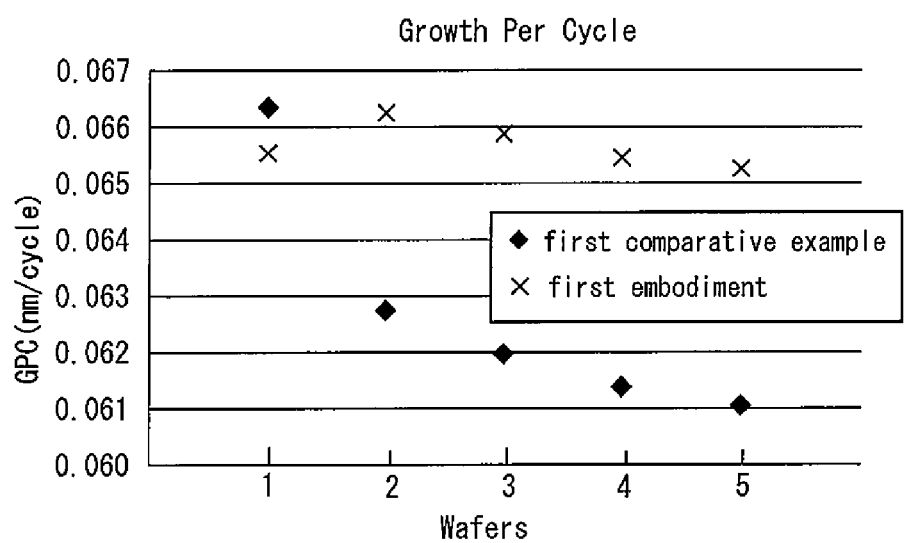
FIG. 9 is a diagram showing the deposition rates of metal films.

FIG. 8 is a diagram showing measured values of the stress in five metal films which were sequentially formed on five different substrates by the method of the first embodiment (using the film forming apparatus 10), and also showing measured values of the stress in five metal films which were sequentially formed on five different substrates by the method of the first comparative example (using the film forming apparatus 50). In the case of the metal films which were sequentially formed by the method of the first comparative example, each metal film had a higher stress than the preceding metal film or films, as shown in FIG. 8. FIG. 9 is a diagram showing the deposition rates of five metal films which were sequentially formed on five different substrates by the method of the first embodiment (using the film forming apparatus 10), and also showing the deposition rates of five metal films which were sequentially formed on five different substrates by the method of the first comparative example (using the film forming apparatus 50). In the case of the metal films which were sequentially formed by the method of the first comparative example, the deposition rate of each metal film was slower than that of the preceding metal film or films, as shown in FIG. 9. It is considered that the method of the second comparative example (in which an insulating film is formed on a substrate in the film forming apparatus 50) also results in unstable film forming operation.

In contrast, in the film forming apparatus 10 of the first embodiment, a plurality of films (metal or insulating films) can be sequentially formed on different substrates while maintaining the deposition rates of these films substantially constant so that the films have substantially equal stresses therein, as shown in FIGS. 8 and 9.

Various alterations may be made to the film forming apparatus 10 while retaining the features of the invention. For example, the exhaust side metal film 36 is not particularly limited to aluminum (Al), but may be made of any suitable material that resists removal by cleaning gas. Further, the material gas described in connection with the first embodiment is not limited to a material gas for depositing titanium nitride, but may be a material gas for forming a different conductive film (such as a different metal-based film), amorphous silicon ($\alpha$-Si), or an insulating film. Further, the film forming method used in connection with the first embodiment is not particularly limited to PEALD, but may be any suitable film forming method using a plasma. It should be noted that these alterations may also be made to the film forming apparatuses and the methods of manufacturing a semiconductor device in accordance with the subsequently described embodiments.

Second Embodiment

Figure 10:
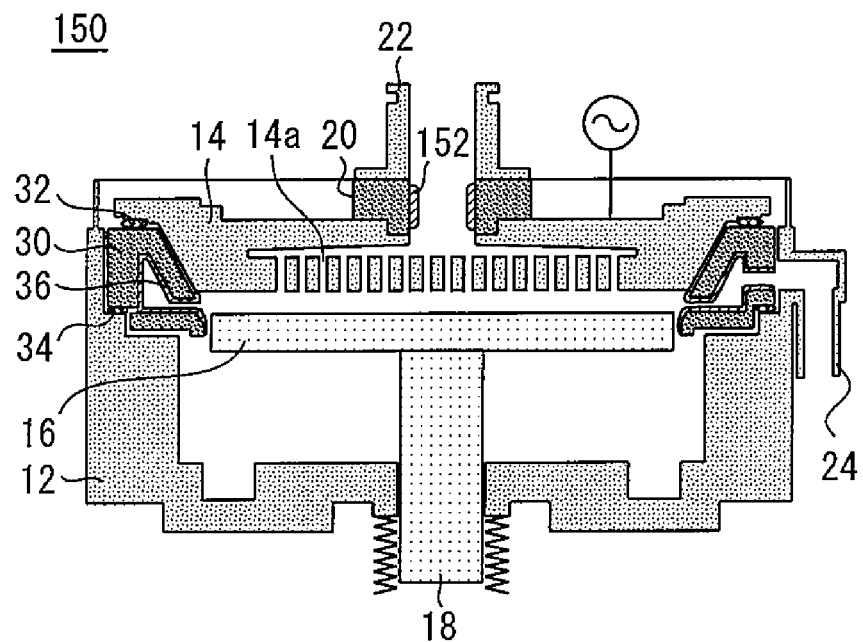
FIG. 10 is a cross-sectional view of a film forming apparatus of the second embodiment.

A second embodiment of the present invention provides a film forming apparatus and a method of manufacturing a semiconductor device which have many features common to the film forming apparatus and the method of manufacturing a semiconductor device in accordance with the first embodiment. Therefore, the following description of the second embodiment will be primarily limited to the differences from the first embodiment. FIG. 10 is a cross-sectional view of a film forming apparatus 150 of the second embodiment. In this film forming apparatus, an insulating part 20 formed of an insulating material is provided between the first electrode 14 and the gas supply inlet 22. The insulating part 20 is formed of, e.g., ceramic. The insulating part 20 is covered with a metal film 152. The metal film 152 is made of Al. The metal film 152 is formed in a manner without electrically connecting the first electrode 14 to the gas supply inlet 22.

If it were not for the metal film 152 in this film forming apparatus, the insulating part 20 would be exposed to the material gas flow path at least during the beginning of the film forming process in the apparatus, thereby varying the impedance of the plasma in the space between the first electrode 14 and the second electrode 16, as is the case where the exhaust side insulating part 30 is exposed to the material gas flow path. Another problem is that an unwanted plasma would be produced in the gas around the insulating part 20. The presence of the metal film 152 prevents these problems; that is, it enables this film forming apparatus to reliably form a film on a substrate.

Third Embodiment

There will be now described a method of manufacturing a semiconductor device in accordance with a third embodiment of the present invention. This method uses, e.g., the film forming apparatus of FIG. 5, in which the exhaust side insulating part 30 is not initially covered with a metal film and hence is initially exposed to the material gas flow path in the reactor chamber 12. The method begins by forming a metal film on the exhaust side insulating part 30 (of an insulating material) using a plasma in a preliminary metal film forming step. The voltage applied between the first electrode 14 and the second electrode 16 in this step may be the same as that applied in the subsequent film forming step in which a film is formed on a substrate to processed. As a result of the above preliminary metal film forming step, the exhaust side insulating part 30 is covered with a metal film and hence is not directly exposed to the material gas flow path in the reactor chamber 12. It should be noted that the substrate to be processed is not placed in the reactor chamber 12 of the film forming apparatus 10 in the preliminary metal film forming step, since the impedance of the plasma in the chamber varies and hence the film forming conditions are unstable during the beginning of the preliminary metal film forming step.

The method then proceeds to the film forming step, in which a film is formed on a substrate to be processed using a plasma while maintaining the exhaust side insulating part 30 unexposed to the material gas flow path. It should be noted that the film formed in the film forming step may be a metal film or an insulating film.

Thus the method of manufacturing a semiconductor device in accordance with the third embodiment includes the preliminary metal film forming step, in which the exhaust side insulating part 30 is covered with a metal film so that the exhaust side insulating part 30 is not directly exposed to the material gas flow path. After this preliminary metal film forming step, a film is formed on a substrate to be processed, resulting in film formation under stable conditions.

In accordance with one aspect of the present invention, a film can be formed in a film forming apparatus in which insulating material is not exposed to the material gas flow path in the chamber even at the beginning of the film forming process, thereby ensuring stable film forming operation.

Fourth Embodiment

Figure 11:
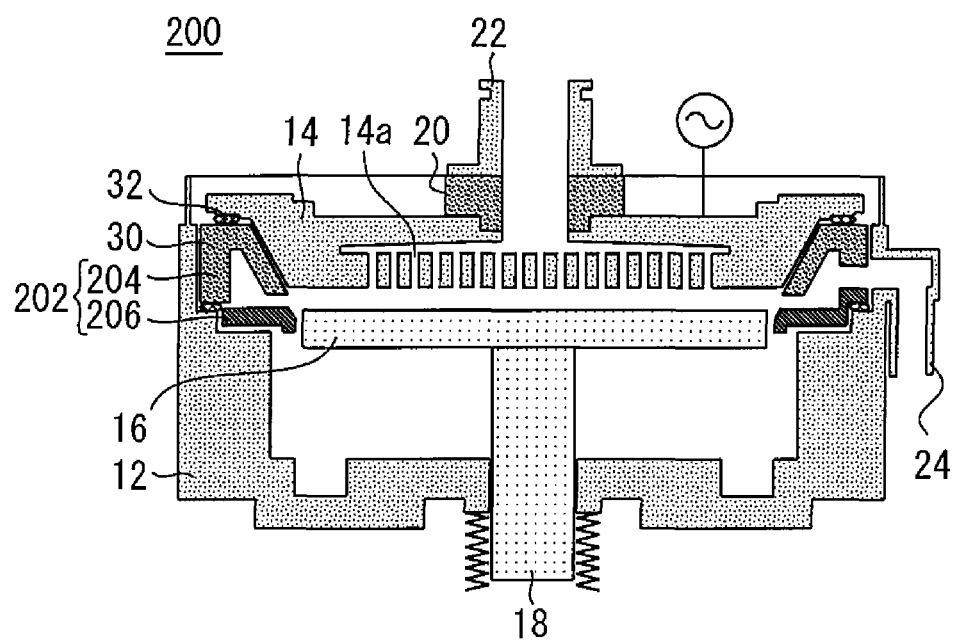
FIG. 11 is a cross-sectional view of a film forming apparatus in accordance with a fourth embodiment.

A fourth embodiment of the present invention provides a film forming apparatus and a method of manufacturing a semiconductor device which have many features common to the film forming apparatus and the method of manufacturing a semiconductor device in accordance with the first embodiment. Therefore, the following description of the fourth embodiment will be primarily limited to the differences from the first embodiment. FIG. 11 is a cross-sectional view of a film forming apparatus 200 of the fourth embodiment.

In this film forming apparatus 200, a separation ring 202 is provided between the first electrode 14 and the reactor chamber 12 so that the first electrode 14 is insulated from the reactor chamber 12. The separation ring 202 has an insulating portion 204 and a metal portion 206. The metal portion 206 is formed of, e.g., aluminum.

The separation ring 202 according to the fourth embodiment includes the metal portion 206, thus the impedance of the plasma remains substantially constant from the beginning to the end of the film forming process, ensuring stable film forming operation as compared to the case where separation ring (exhaust side insulating part 30) shown in FIG. 5 is used. It is preferable to surround the second electrode 16 by the metal portion 206 to enhance the stability of the film forming operation.

Further, when an insulating film is formed in the film forming apparatus 200, the metal portion 206 serves to prevent a potential difference from being generated in the separation ring 200.

Features of the film forming apparatuses and the method of manufacturing semiconductor device of the first to fourth embodiments may be combined where appropriate.

Obviously many modifications and variations of the present invention are possible in the light of the above teachings. It is therefore to be understood that within the scope of the appended claims the invention may be practiced otherwise than as specifically described.

What is claimed is:

1. A film forming apparatus comprising:
   a reactor chamber;
   a first electrode provided in said reactor chamber and receiving electrical power;
   a second electrode provided in said reactor chamber and facing said first electrode;
   a gas supply inlet for supplying material gas to a space between said first and second electrodes;
   a gas exhaust outlet for discharging said material gas;
   an exhaust side insulating part formed of an insulating material and disposed between said first electrode and said reactor chamber, said exhaust side insulating part forming a portion of a flow path for said material gas and guiding said material gas from between said first and second electrodes to said gas exhaust outlet; and
   an exhaust side metal film covering said exhaust side insulating part in a manner without electrically connecting said first electrode to said reactor chamber,
   wherein insulating material is not exposed to a flow path for said material gas in said reactor chamber.

2. The film forming apparatus according to claim 1, wherein,
   said exhaust side insulating part provides a constricted pathway communicating with between said first and second electrodes,
   said exhaust side insulating part provides a cavity communicating with said constricted pathway,
   said constricted pathway and said cavity are said portion of said flow path, and
   the inside of both said constricted pathway and said cavity are coated with said exhaust side metal film.

3. The film forming apparatus according to claim 2, wherein said exhaust side metal film is aluminum.

4. The film formation apparatus according to claim 1, wherein the film formed is metal-based film.

5. The film forming apparatus according to claim 1, further comprising:
   a insulating part formed of an insulating material and disposed between said first electrode and said gas supply inlet; and
   a metal film covering said insulating part in a manner without electrically connecting said first electrode to said gas supply inlet.

6. The film forming apparatus according to claim 5, wherein said metal film is aluminum.

* * * * *